United States Patent
Ma et al.

(10) Patent No.: US 10,564,538 B2
(45) Date of Patent: Feb. 18, 2020

(54) MASK PLATE, METHOD FOR MANUFACTURING MASK PLATE, AND USAGE OF MASK PLATE IN MANUFACTURING DISPLAY SUBSTRATE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jun Ma, Beijing (CN); Chengshao Yang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/533,449

(22) PCT Filed: Oct. 20, 2016

(86) PCT No.: PCT/CN2016/102687
§ 371 (c)(1),
(2) Date: Jun. 6, 2017

(87) PCT Pub. No.: WO2017/121157
PCT Pub. Date: Jul. 20, 2017

(65) Prior Publication Data
US 2018/0314147 A1    Nov. 1, 2018

(30) Foreign Application Priority Data
Jan. 11, 2016    (CN) .......................... 2016 1 0016716

(51) Int. Cl.
*G02F 1/00*      (2006.01)
*G03F 1/38*      (2012.01)
(Continued)

(52) U.S. Cl.
CPC .............. *G03F 1/38* (2013.01); *G02F 1/1303* (2013.01); *G02F 1/15* (2013.01); *G02F 1/155* (2013.01);
(Continued)

(58) Field of Classification Search
CPC . G03F 1/68; G03F 1/50; G03F 7/2057; G03F 7/70308; G02F 1/15; G02F 1/1514;
(Continued)

(56) References Cited

U.S. PATENT DOCUMENTS 7,851,110 B2    12/2010   Progler
2009/0323156 A1*  12/2009  Shin ........................ G02F 1/153
                                                           359/265

(Continued)

FOREIGN PATENT DOCUMENTS

CN    103513509 A    1/2014
CN    104423139 A    3/2015
(Continued)

OTHER PUBLICATIONS

Computer-generated translation of CN 105116682 A (Dec. 2015). (Year: 2015).*
(Continued)

*Primary Examiner* — John A McPherson
(74) *Attorney, Agent, or Firm* — Brooks Kushman P.C.

(57) ABSTRACT

A mask plate, a method for manufacturing the mask plate and a usage of the mask plate in manufacturing a display substrate are provided. The mask plate includes a transparent substrate and at least two layers of electrochromic thin film patterns arranged on the transparent substrate. Each of the at
(Continued)

least two layers of electrochromic thin film patterns is configured to be capable of being switched between a light-transmissible state and a non-light-transmissible state under an effect of an electric field. The mask plate is capable of forming at least two different mask patterns on the display substrate, which reduces the number of mask plates required for manufacturing the display substrate.

13 Claims, 6 Drawing Sheets

(51) Int. Cl.

| | | |
|---|---|---|
| *G02F 1/15* | (2019.01) | |
| *G03F 1/50* | (2012.01) | |
| *G02F 1/13* | (2006.01) | |
| *G02F 1/155* | (2006.01) | |
| *G02F 1/1368* | (2006.01) | |
| *G02F 1/1516* | (2019.01) | |
| *H01L 27/12* | (2006.01) | |

(52) U.S. Cl.
CPC .............. *G03F 1/50* (2013.01); *G02F 1/1368* (2013.01); *G02F 2001/1517* (2013.01); *H01L 27/1259* (2013.01)

(58) Field of Classification Search
CPC .... G02F 1/1516; G02F 1/1523; G02F 1/1524; G02F 1/55; G02F 1/61; G02F 1/1303; G02F 2001/1517

USPC ............................................................ 430/5
See application file for complete search history.

(56) References Cited

U.S. PATENT DOCUMENTS

| | | | |
|---|---|---|---|
| 2011/0090480 A1* | 4/2011 | Lai ........................ | G03F 7/201 355/70 |
| 2012/0038966 A1* | 2/2012 | Yeh ...................... | G02F 1/1503 359/268 |
| 2015/0049324 A1 | 2/2015 | Tan | |

FOREIGN PATENT DOCUMENTS

| | | |
|---|---|---|
| CN | 105116682 A | 12/2015 |
| CN | 105629655 A | 6/2016 |
| KR | 20130006743 A | 1/2013 |

OTHER PUBLICATIONS

First Office Action for Chinese Application No. 201610016716.X, dated Dec. 5, 2017, 6 Pages.

International Search Report and Written Opinion for Application No. PCT/CN2016/102687, dated Nov. 1, 2017, 10 Pages.

\* cited by examiner

MASK PLATE, METHOD FOR MANUFACTURING MASK PLATE, AND USAGE OF MASK PLATE IN MANUFACTURING DISPLAY SUBSTRATE

CROSS-REFERENCE TO RELATED APPLICATIONS

This application is a U.S. national phase of PCT Application No. PCT/CN2016/102687 filed on Oct. 20, 2016, which claims priority to Chinese Patent Application No. 201610016716.X filed on Jan. 11, 2016, the disclosures of which are incorporated in their entirety by reference herein.

TECHNICAL FIELD

The present disclosure relates to the technical field of displaying technology, in particular to a mask plate.

BACKGROUND

The mask plate is a patterning assembly used in a photoetching process for manufacturing a Thin Film Transistor Liquid Crystal Display (TFT-LCD). The mask plate generally includes a transparent substrate and a non-light-transmissible region including a particular pattern formed on the transparent substrate.

Typically, during a process of manufacturing the mask plate in the related art, firstly a non-light-transmissible layer (e.g. an layer of chromium) is deposited on a transparent substrate, and then the non-light-transmissible layer is patterned by an electron beam or laser according to a predetermined pattern, and finally the non-light-transmissible layer is subjected to patterning procedures such as developing, etching and film-removing, so as to form the non-light-transmissible region including the particular pattern on the transparent substrate.

However, in the related art, the pattern on each mask plate is unchangeable, i.e. each mask plate uniquely corresponds to one pattern. Due to a fact that a plurality of patterns is required to be formed on a base substrate sequentially during a process of manufacturing a display substrate, a plurality of mask plates corresponding to the patterns respectively has to be prepared. As a result, the process of manufacturing the TFT-LCD is complex, and the manufacturing cost is high.

SUMMARY

An object of the present disclosure is to provide a mask plate, a method for manufacturing the mask plate and a usage of the mask plate in manufacturing a display substrate, so as to eliminate or at least alleviate one or more problems in the mask plate of the related art.

In one aspect, the present disclosure provides in some embodiments a mask plate including: a transparent substrate, and at least two layers of electrochromic thin film patterns arranged on the transparent substrate, wherein each of the at least two layers of electrochromic thin film patterns is configured to be capable of being switched between a light-transmissible state and a non-light-transmissible state under an effect of an electric field. In this embodiment, the at least two layers of electrochromic thin film patterns may form at least two different mask patterns on the display substrate under the effect of the electric fields.

In the embodiments of the present disclosure, the mask plate further includes: transparent electrodes arranged at two sides of each of the at least two layers of electrochromic thin film patterns, wherein the transparent electrodes are configured to apply the electric field to each of the at least two layers of electrochromic thin film patterns.

In the embodiments of the present disclosure, at least one layer of electrochromic thin film pattern is formed at each of two sides of the transparent substrate.

In the embodiment of the present disclosure, a first lower transparent electrode, a first electrochromic thin film pattern and a first upper transparent electrode are arranged sequentially at one of the two sides of the transparent substrate, and a second lower transparent electrode, a second electrochromic thin film pattern and a second upper transparent electrode are arranged sequentially at the other one of the two sides of the transparent substrate.

In the embodiments of the present disclosure, the at least two layers of electrochromic thin film patterns are arranged at a same side of the transparent substrate.

In the embodiments of the present disclosure, a lower transparent electrode, a first electrochromic thin film pattern, a common transparent electrode, a second electrochromic thin film pattern and a upper transparent electrode are arranged sequentially at the same side of the transparent substrate, and the common transparent electrode is configured to be applied with a voltage less than a voltage applied to the lower transparent electrode and less than a voltage applied to the upper transparent electrode.

In the embodiments of the present disclosure, each of the at least two layers of electrochromic thin film patterns includes a upper transparent electrode arranged at one side of the layer of electrochromic thin film pattern, and a lower transparent electrode arranged at the other side of the layer of electrochromic thin film pattern, the mask plate further includes a plurality of transparent insulation layers, and each of the transparent insulation layers is arranged between a lower transparent electrode of one layer of electrochromic thin film pattern and a upper transparent electrode of another layer of electrochromic thin film pattern adjacent to the one layer of electrochromic thin film pattern.

In the embodiments of the present disclosure, a first upper transparent electrode, a first electrochromic thin film pattern, a first lower transparent electrode, a first transparent insulation layer, a second upper transparent electrode, a second electrochromic thin film pattern, a second lower transparent electrode, a second transparent insulation layer, a third upper transparent electrode, a third electrochromic thin film pattern and a third lower transparent electrode are arranged sequentially at the same side of the transparent substrate.

In the embodiments of the present disclosure, each of the at least two layers of electrochromic thin film patterns includes at least two electrochromic thin film units spaced apart from each other, and a gap between the at least two electrochromic thin film units is filled with a transparent insulation material.

In the embodiments of the present disclosure, the mask plate further includes: a control module arranged at a periphery of the transparent substrate and electrically connected to transparent electrodes of each of the at least two layers of electrochromic thin film patterns, wherein the control module is configured to control a voltage applied across each of the at least two layers of electrochromic thin film patterns.

In the embodiments of the present disclosure, the electrochromic thin film patterns are made of Prussian blue (also called ferric ferrocyanide).

In the embodiments of the present disclosure, the transparent electrodes are Indium Tin Oxide (ITO) layers.

In the embodiments of the present disclosure, the transparent insulation material is silicon oxide, silicon nitride or silicon oxynitride.

In the embodiments of the present disclosure, orthogonal projections of the at least two layers of electrochromic thin film patterns on the transparent substrate are different from each other. In another aspect, the present disclosure provides in some embodiments a usage of the above mask plate in manufacturing a display substrate.

In yet another aspect, the present disclosure provides in some embodiments a method for manufacturing the above mask plate, including: providing the transparent substrate; and forming the at least two layers of electrochromic thin film patterns on the transparent substrate, wherein each of the at least two layers of electrochromic thin film patterns is configured to be capable of being switched between the light-transmissible state and the non-light-transmissible state under the effect of the electric field.

In the embodiments of the present disclosure, forming the at least two layers of electrochromic thin film patterns on the transparent substrate includes: forming transparent electrodes at two sides of each of the at least two layers of electrochromic thin film patterns, wherein the transparent electrodes are configured to apply the electric field to each of the at least two layers of electrochromic thin film patterns.

In the embodiments of the present disclosure, forming the at least two layers of electrochromic thin film patterns on the transparent substrate includes: forming at least one layer of electrochromic thin film pattern at each of two sides of the transparent substrate.

In the embodiment of the present disclosure, forming the at least two layers of electrochromic thin film patterns on the transparent substrate includes: forming a first lower transparent electrode, a first electrochromic thin film pattern and a first upper transparent electrode sequentially at one of the two sides of the transparent substrate; and forming a second lower transparent electrode, a second electrochromic thin film pattern and a second upper transparent electrode sequentially at the other one of the two sides of the transparent substrate.

In the embodiment of the present disclosure, forming the at least two layers of electrochromic thin film patterns on the transparent substrate includes: forming a lower transparent electrode, a first electrochromic thin film pattern, a common transparent electrode, a second electrochromic thin film pattern and a upper transparent electrode sequentially at one side of the transparent substrate.

In the embodiments of the present disclosure, forming the at least two layers of electrochromic thin film patterns on the transparent substrate includes: forming a first upper transparent electrode, a first electrochromic thin film pattern, a first lower transparent electrode, a first transparent insulation layer, a second upper transparent electrode, a second electrochromic thin film pattern, a second lower transparent electrode, a second transparent insulation layer, a third upper transparent electrode, a third electrochromic thin film pattern and a third lower transparent electrode sequentially at one side of the transparent substrate.

BRIEF DESCRIPTION OF THE DRAWINGS

In order to illustrate the technical solutions of the present disclosure in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in more details in conjunction with the drawings.

Figure 1:
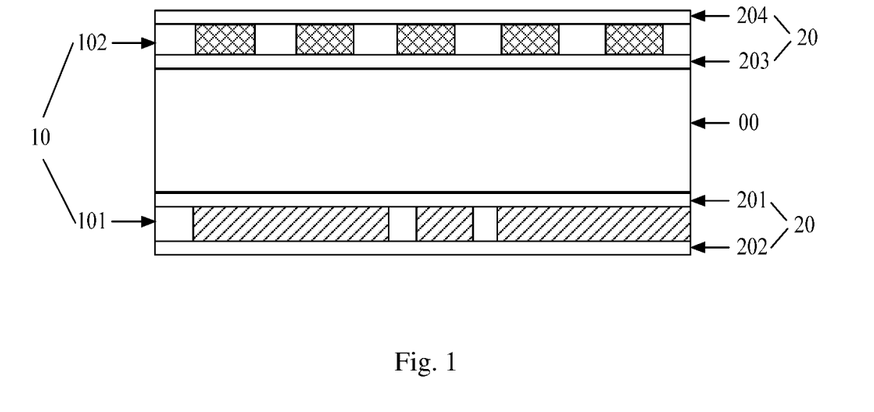
FIG. 1 is a side view showing a mask plate according to some embodiments of the present disclosure.

FIG. 1 is a side view showing a mask plate according to some embodiments of the present disclosure. As shown in FIG. 1, the mask plate includes a transparent substrate 00. At least two layers of electrochromic thin film patterns 10 are formed on the transparent substrate 00, and transparent electrodes 20 are formed at two sides of each of the at least two layers of electrochromic thin film patterns. For example, in the mask plate as shown in FIG. 1, two layers of electrochromic thin film patterns 101 and 102 are formed on the transparent substrate 00. Transparent electrodes 201 and 202 are formed at two sides of the electrochromic thin film pattern 101, and transparent electrodes 203 and 204 are formed at two sides of the electrochromic thin film pattern 102.

The at least two layers of electrochromic thin film patterns 10 are configured to form at least two different mask patterns on a display substrate (not shown) under the effect of the transparent electrodes 20.

Thus, the present disclosure provides in some embodiments a mask plate, including: a transparent substrate and at least two layers of electrochromic thin film patterns formed on the transparent substrate, the at least two layers of electrochromic thin film patterns are configured to form at least two different mask patterns on a display substrate under the effect of the transparent electrodes, so as to reduce the number of mask plates required for manufacturing the display substrate, thereby to simplify the process of manufacturing the TFT-LCD, and reduce the cost for manufacturing the TFT-LCD.

In the embodiments of the present disclosure, orthogonal projections of the at least two layers of electrochromic thin film patterns 10 on the transparent substrate 00 are different from each other. For example, the orthogonal projections of the at least two layers of electrochromic thin film patterns 10 on the transparent substrate 00 are not overlapped at all, or partially but not completely overlapped, which enables the at least two layers of electrochromic thin film patterns 10 to form the at least two different mask patterns on the display substrate under the effect of the transparent electrodes.

For example, in the embodiments of the present disclosure, at least one layer of electrochromic thin film pattern is formed at each of two sides of the transparent substrate 00. For example, in the mask plate as shown in FIG. 1, two layers of electrochromic thin film patterns 101 and 102 are formed at two sides of the transparent substrate 00 respectively. The first lower transparent electrode 201 is formed at one side of the transparent substrate 00, the first electrochromic thin film pattern 101 is formed on the first lower transparent electrode 201, and the first upper transparent electrode 202 is formed on the first electrochromic thin film pattern 101. The second lower transparent electrode 203 is formed at the other side of the transparent substrate 00, the second electrochromic thin film pattern 102 is formed on the second lower transparent electrode 203, and the second upper transparent electrode 204 is formed on the second electrochromic thin film pattern 102. Two layers of electrochromic thin film patterns 101 and 102 are formed at two sides of the mask plate respectively. As a result, during an exposure process, a light beam may reach the display substrate after being transmitted through one layer of electrochromic thin film pattern, so as to prevent the light beam from being refracted upon being transmitted through multiple layers of electrochromic thin film patterns, and thus guarantee a quality of the display substrate being manufactured.

Figure 2:
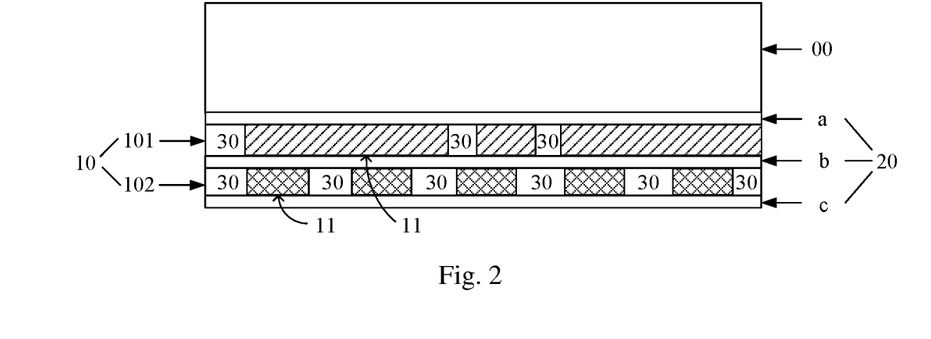
FIG. 2 is another side view showing a mask plate according to some embodiments of the present disclosure.

FIG. 2 is a side view showing another mask plate according to some embodiments of the present disclosure. As shown in FIG. 2, in the embodiments of the present disclosure, two layers of electrochromic thin film patterns 101, 102 are formed at at least one of the two sides of the transparent substrate 00. In other words, a lower transparent electrode a is formed at one side of the transparent substrate 00. The first electrochromic thin film pattern 101 is formed on the lower transparent electrode a. A common transparent electrode b is formed on the first electrochromic thin film pattern 101. The second electrochromic thin film pattern 102 is formed on the common transparent electrode b. An upper transparent electrode c is formed on the second electrochromic thin film pattern 102. A voltage applied to the common transparent electrode b is less than a voltage applied to the lower transparent electrode a and a voltage applied to the upper transparent electrode c. For example, the common transparent electrode b is connected to a negative pole of a power source. As a result, the common transparent electrode is formed between two layers of electrochromic thin film patterns, so as to reduce the number of transparent electrodes required to be formed in the mask plate, thereby to simplify the process of manufacturing the mask plate, and reduce the cost for manufacturing the mask plate.

For example, as shown in FIG. 2, each of the electrochromic thin film patterns includes at least two electrochromic thin film units 11 spaced apart from each other. Gaps between every two adjacent electrochromic thin film units 11 are filled with a transparent insulation material 30. The gaps between every two adjacent electrochromic thin film units 11 include regions not covered by the electrochromic thin film units 11 on the transparent electrode 20. The transparent insulation material 30 protects the electrochromic thin film pattern 10, and improves roughness of a surface of the mask plate.

Figure 3:
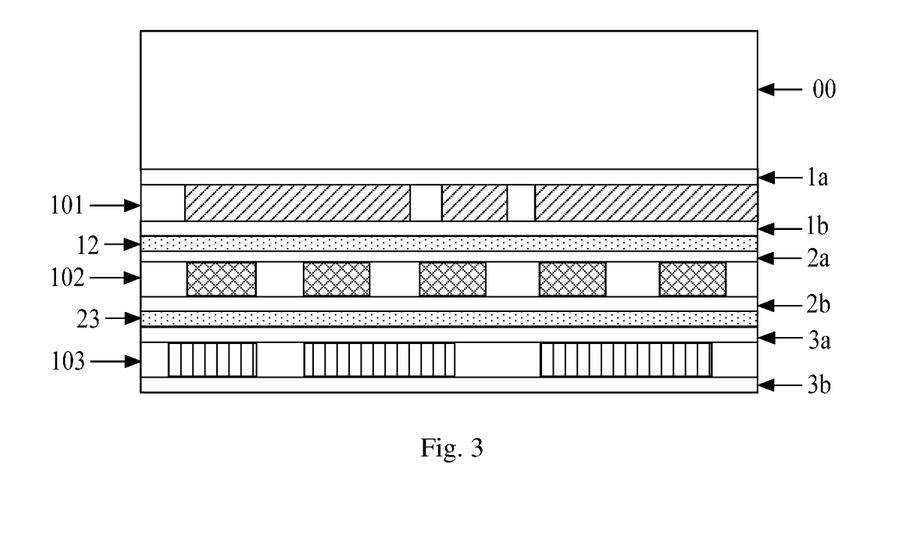
FIG. 3 is yet another side view showing a mask plate according to some embodiments of the present disclosure.

It should be noted that, in the embodiments of the present disclosure, more than two layers of electrochromic thin film patterns may be formed at either one of the two sides of the mask plate. For example, as shown in FIG. 3, three layers of electrochromic thin film patterns 101, 102 and 103 are formed at one side of the mask plate, wherein an upper transparent electrode and a lower transparent electrode are formed at two sides of each layer of electrochromic thin film pattern respectively. For example, an upper transparent electrode 1a and a lower transparent electrode 1b are formed at two sides of the electrochromic thin film pattern 101 respectively, an upper transparent electrode 2a and a lower transparent electrode 2b are formed at two sides of the electrochromic thin film pattern 102 respectively, and an upper transparent electrode 3a and a lower transparent electrode 3b are formed at two sides of the electrochromic thin film pattern 103 respectively. The transparent insulation layer is formed between two adjacent transparent electrodes. For example, a transparent insulation layer 12 is formed between the transparent electrodes 1b and 2a, and a transparent insulation layer 23 is formed between the transparent electrodes 2b and 3a. The transparent insulation layers 12 and 23 electrically insulate the two adjacent transparent electrodes from each other, and prevent the two adjacent transparent electrodes from interfering each other, such that the transparent electrodes at two sides of each layer of electrochromic thin film pattern control a light-transmissible state of the layer of electrochromic thin film pattern independently.

Figure 4:
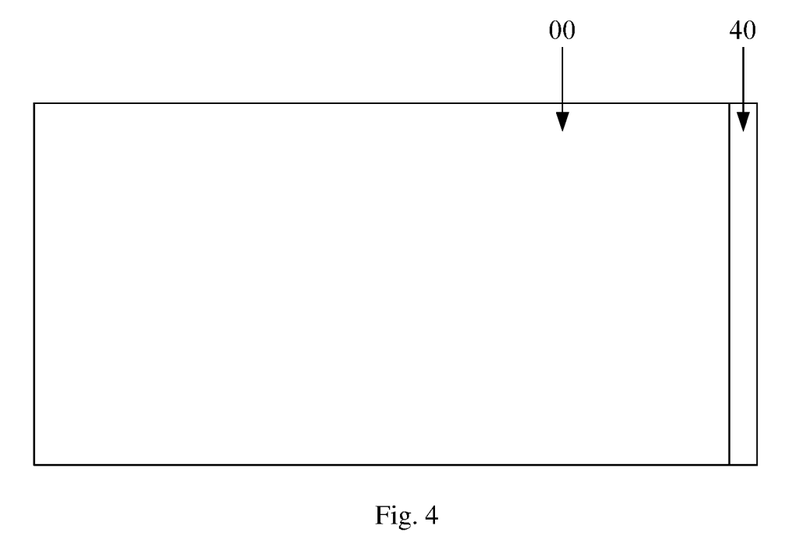
FIG. 4 is a top view showing a mask plate according to some embodiments of the present disclosure.

FIG. 4 is a top view showing yet another mask plate according to some embodiments of the present disclosure. As shown in FIG. 4, the mask plate further includes a control module 40 arranged at periphery of the transparent substrate 00. The control module 40 is electrically connected to transparent electrodes formed at two sides of each layer of electrochromic thin film pattern, and configured to control a voltage at each layer of electrochromic thin film pattern, so as to adjust a light-transmitting state of each layer of electrochromic thin film pattern. The light-transmitting state includes a light-transmissible state and a non-light-transmissible state. The control module 40 is provided at periphery of the transparent substrate 00, and thus may not adversely affect the mask pattern formed by the mask plate on the display substrate.

The non-light-transmissible state is a state where the light beam is blocked in entirety. The light-transmissible state is a state where most of the light beams are transmitted, e.g. at least 60%, at least 70%, at least 80%, at least 90% or even 100% of the light beams are transmitted. Herein, the light beams are used for exposing through the mask plate during the process of manufacturing the display substrate.

In actual implementation, a light-transmitting state of a target electrochromic thin film pattern in the at least two layers of electrochromic thin film patterns is adjusted to be the non-light-transmissible state by the control module, and a light-transmitting state of other target electrochromic thin film patterns in the at least two layers of electrochromic thin film patterns is adjusted to be the light-transmissible state by the control module. Thereby, it enables to form a mask pattern on the base substrate of the display substrate by using the target electrochromic thin film pattern. The target electrochromic thin film pattern corresponds to a mask pattern to be formed on the display substrate. In the process of manufacturing the display substrate, an operator may select, based on a manufacturing schedule, a particular electrochromic thin film pattern from the at least two layers of electrochromic thin film patterns as the target electrochromic thin film pattern, and adjust, by the control module, the light-transmitting state of the target electrochromic thin film pattern to be the non-light-transmissible state, and the light-transmitting state of the other electrochromic thin film patterns to be the light-transmissible state.

In the above embodiments, for example, the electrochromic thin film pattern may formed by a Prussian blue thin film through a single patterning process, the transparent substrate may be a quartz glass substrate, the transparent electrode may be an ITO layer, and the transparent insulation material may be silicon oxide, silicon nitride or silicon oxynitride. In addition, for example, the transparent insulation layer may be made of silicon oxide, silicon nitride or silicon oxynitride.

Thus, the present disclosure provides in some embodiments a mask plate, including: a transparent substrate and at least two layers of electrochromic thin film patterns formed on the transparent substrate. The at least two layers of electrochromic thin film patterns is configured to form at least two different mask patterns on a display substrate under the effect of the transparent electrodes. In contrast, in the related art, the pattern on each mask plate is unchangeable, i.e. each mask plate uniquely corresponds to one pattern. In the process of manufacturing the display panel, a plurality of patterns, such as the a pattern of gate scanning lines, a pattern of an active layer, and a pattern of a passivation layer are required to be formed on the base substrate sequentially, and thus it is necessary to prepare a plurality of mask plates corresponding to the patterns to be formed respectively. In the embodiments of the present disclosure, at least two patterns may be formed on the display substrate through a single patterning mask. As a result, it enables to reduce the number of mask plates required for manufacturing the display substrate, thereby to simplify the process of manufacturing the TFT-LCD, and reduce the cost for manufacturing the TFT-LCD.

Figure 5:
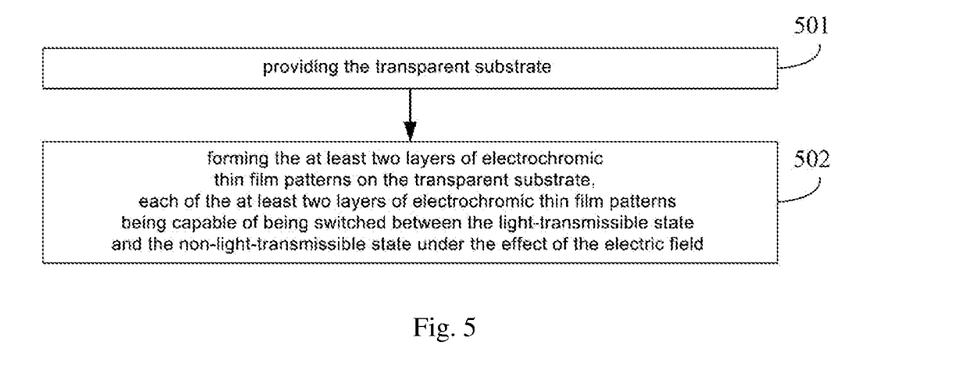
FIG. 5 is a flow chart showing a method for manufacturing a mask plate according to some embodiments of the present disclosure.

FIG. 5 is a flow chart showing a method for manufacturing a mask plate according to some embodiments of the present disclosure. As shown in FIG. 5, in the embodiments of the present disclosure, the method includes: providing the transparent substrate; and forming the at least two layers of electrochromic thin film patterns on the transparent substrate, wherein each of the at least two layers of electrochromic thin film patterns is configured to be capable of being switched between the light-transmissible state and the non-light-transmissible state under the effect of the electric field.

For example, forming the at least two layers of electrochromic thin film patterns on the transparent substrate includes: forming transparent electrodes at two sides of each of the at least two layers of electrochromic thin film patterns, wherein the transparent electrodes are configured to apply the electric field to each of the at least two layers of electrochromic thin film patterns.

For example, forming the at least two layers of electrochromic thin film patterns on the transparent substrate includes: forming at least one layer of electrochromic thin film pattern at each of two sides of the transparent substrate.

For example, forming the at least two layers of electrochromic thin film patterns on the transparent substrate includes: forming a first lower transparent electrode, a first electrochromic thin film pattern and a first upper transparent electrode sequentially at one of the two sides of the transparent substrate; and forming a second lower transparent electrode, a second electrochromic thin film pattern and a second upper transparent electrode sequentially at the other one of the two sides of the transparent substrate.

For example, forming the at least two layers of electrochromic thin film patterns on the transparent substrate includes: forming a lower transparent electrode, a first electrochromic thin film pattern, a common transparent electrode, a second electrochromic thin film pattern and a upper transparent electrode sequentially at one side of the transparent substrate.

For example, forming the at least two layers of electrochromic thin film patterns on the transparent substrate includes: forming a first upper transparent electrode, a first electrochromic thin film pattern, a first lower transparent electrode, a first transparent insulation layer, a second upper transparent electrode, a second electrochromic thin film pattern, a second lower transparent electrode, a second transparent insulation layer, a third upper transparent electrode, a third electrochromic thin film pattern and a third lower transparent electrode sequentially at one side of the transparent substrate.

In the following, the above methods will be further explained in details in the embodiments.

Figure 6A:
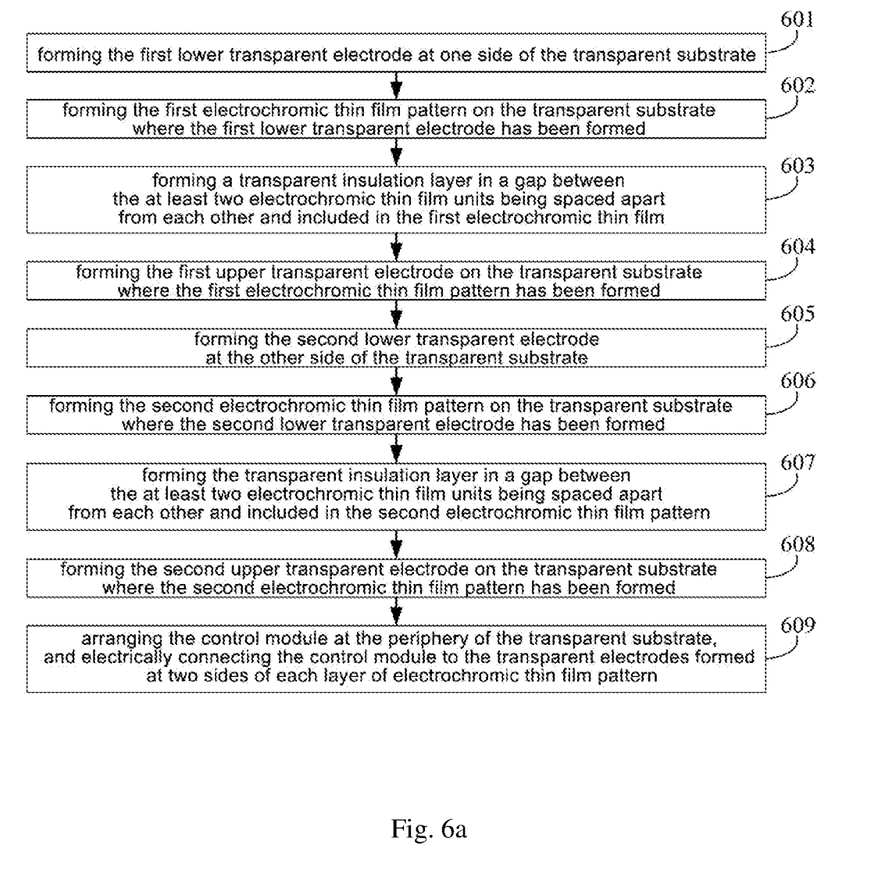
FIG. 6a is a flow chart showing a method for manufacturing a mask plate according to some embodiments of the present disclosure.

FIG. 6a is a flow chart showing a method for manufacturing a mask plate according to some embodiments of the present disclosure. For example, the method for manufacturing the mask plate as shown in FIG. 1 includes the following steps.

Step 601: forming the first lower transparent electrode at one side of the transparent substrate.

Figure 6B:
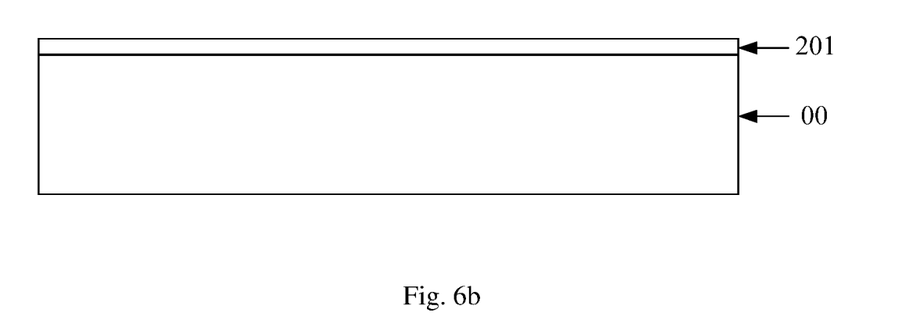
FIG. 6b is a side view showing a first lower transparent electrode being formed according to some embodiments of the present disclosure.

For example, the first lower transparent electrode 201 is formed at one side of the transparent substrate 00 as shown in FIG. 6b. For example, the first lower transparent electrode 201 may be an ITO layer.

Step 602: forming the first electrochromic thin film pattern on the transparent substrate where the first lower transparent electrode has been formed.

Figure 6C:
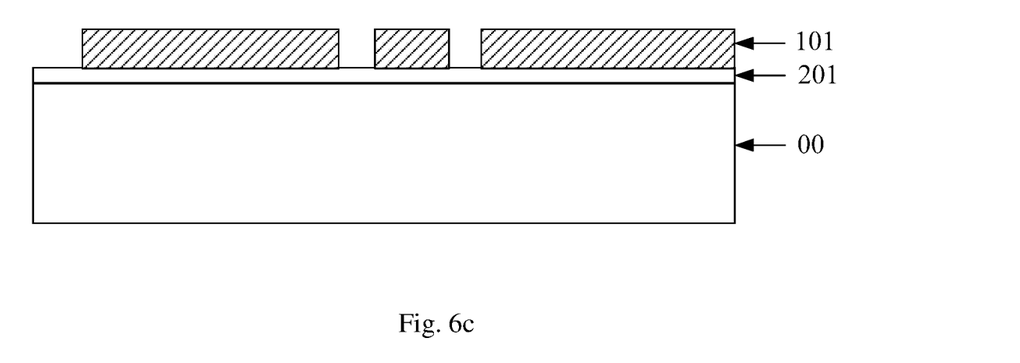
FIG. 6c is a side view showing a first electrochromic thin film pattern being formed according to some embodiments of the present disclosure.

As shown in FIG. 6c, a layer of electrochromic thin film, e.g. the Prussian blue thin film is deposited on the transparent substrate 00 where the first lower transparent electrode 201 has been formed. Hereafter, the first electrochromic thin film pattern 101 is formed by a single patterning process. The first mask pattern is formed on the display substrate by the first electrochromic thin film pattern 101.

Step 603: filling a gap between the at least two electrochromic thin film units being spaced apart from each other and included in the first electrochromic thin film pattern with the transparent insulation material.

Figure 6D:
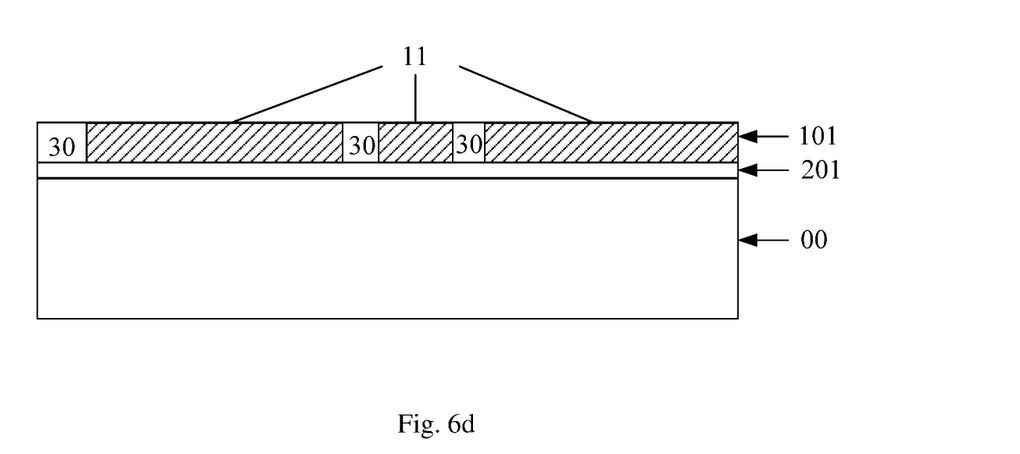
FIG. 6d is a side view showing a transparent insulation material being formed according to some embodiments of the present disclosure.

For example, as shown in FIG. 6d, the first electrochromic thin film pattern 101 includes at least two electrochromic thin film units 11 spaced apart from each other. The gap between the two adjacent electrochromic thin film units 11 is filled with the transparent insulation material 30, so as to improve the roughness of the surface of the mask plate, and protect the first electrochromic thin film pattern 101. For example, the gap further includes a region not covered by the electrochromic thin film unit 11 on the first lower transparent electrode 201.

Step 604: forming the first upper transparent electrode on the transparent substrate where the first electrochromic thin film pattern has been formed.

Figure 6E:
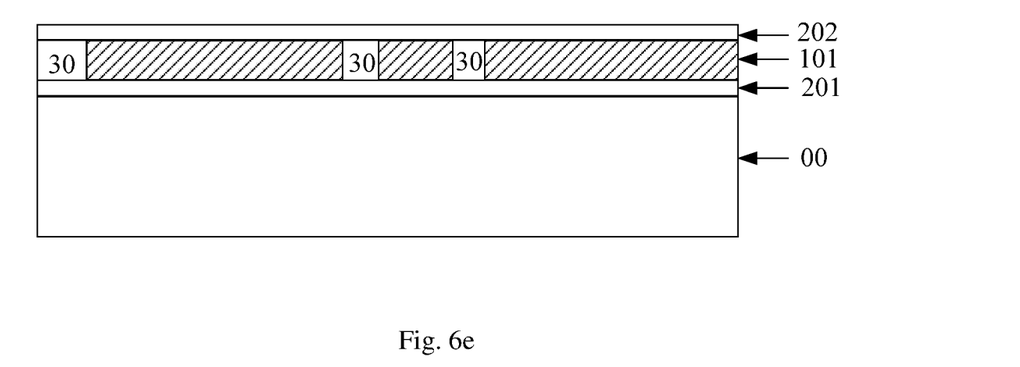
FIG. 6e is a schematic view showing a first upper transparent electrode being formed according to some embodiments of the present disclosure.

As shown in FIG. 6e, the first upper transparent electrode 202 is formed on the transparent substrate 00 where the first electrochromic thin film pattern 101 has been formed, such that the patterns at one side of the mask plate are implemented.

Step 605: forming the second lower transparent electrode at the other side of the transparent substrate.

Step 606: forming the second electrochromic thin film pattern on the transparent substrate where the second lower transparent electrode has been formed.

Step 607: filling a gap between the at least two electrochromic thin film units being spaced apart from each other and included in the second electrochromic thin film pattern with the transparent insulation material.

Step 608: forming the second upper transparent electrode on the transparent substrate where the second electrochromic thin film pattern has been formed.

The steps 605-608 are executed for forming the second electrochromic thin film pattern at the other side of the mask plate, the details thereof are similar to those of steps 601-604, and thus will not be repeated herein.

Step 609: arranging the control module at the periphery of the transparent substrate, and electrically connecting the control module to the transparent electrodes formed at two sides of each layer of electrochromic thin film pattern.

As shown in FIG. 4, the control module 40 is arranged at the periphery of the transparent substrate 00. The control module 40 is electrically connected to transparent electrodes formed at two sides of each layer of electrochromic thin film pattern, so as to control a voltage at each layer of electrochromic thin film pattern, and thereby to adjust a light-transmitting state of each layer of electrochromic thin film pattern.

It should be noted that, in the above method for manufacturing the mask plate, the sequence for executing the steps may be adjusted and the number of the steps may be increased or decreased, depending on the actual requirements. For example, in the method for manufacturing the mask plate, the sequence for executing the steps are: step 601, step 605, step 602, step 606, step 603, step 607, step 604, step 608, and then step 609. A person skilled in the art may easily conceive many modifications according to the description of the present disclosure, which also fall within the protection scope of the present disclosure and will not be elaborated herein.

It should be further noted that, the mask plate in any one of FIGS. 2-4 may be manufactured according to the method for manufacturing the mask plate in the embodiments of the present disclosure. For details of the manufacturing process, it may refer to the above steps 601-608.

Therefore, according to the method for manufacturing the mask plate in the embodiments of the present disclosure, it enables to form a layer of electrochromic thin film pattern at each of the two sides of the mask plate, by which it may form two different mask patterns on the display substrate, so as to reduce the number of mask plates required for manufacturing the display substrate, thereby to simplify the process of manufacturing the TFT-LCD, and reduce the cost for manufacturing the TFT-LCD.

Figure 7A:
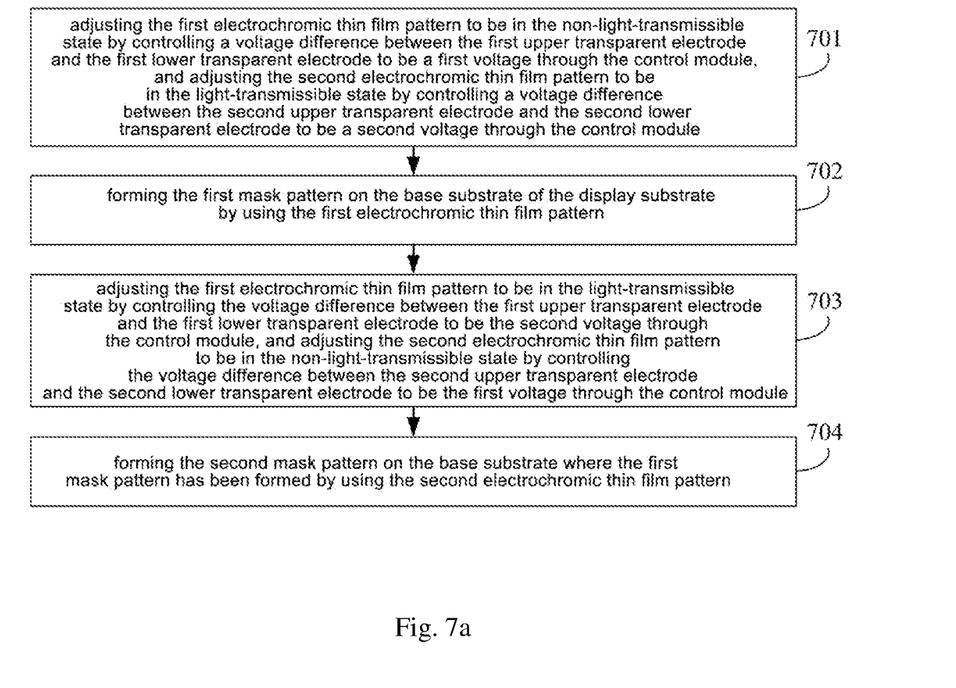
FIG. 7a is a flow chart showing a method for manufacturing a display substrate according to some embodiments of the present disclosure.

FIG. 7a is a flow chart showing a method for manufacturing a display substrate according to some embodiments of the present disclosure. Taking the mask plate in FIG. 1 as an example, the method includes the following steps.

Step 701: adjusting the first electrochromic thin film pattern to be in the non-light-transmissible state by controlling a voltage difference between the first upper transparent electrode and the first lower transparent electrode to be a first voltage through the control module, and adjusting the second electrochromic thin film pattern to be in the light-transmissible state by controlling a voltage difference between the second upper transparent electrode and the second lower transparent electrode to be a second voltage through the control module.

In the embodiments of the present disclosure, the light-transmitting state of the electrochromic thin film pattern may be changed by adjusting the voltage applied to the electrochromic thin film pattern. For example, for the electrochromic thin film pattern formed by the Prussian blue thin film, when the voltage applied to the electrochromic thin film pattern is a high level, the electrochromic thin film pattern may be in the light-transmissible state, and when the voltage applied to the electrochromic thin film pattern is a low level, the electrochromic thin film pattern may be in the non-light-transmissible state. Thus, in the embodiments of the present disclosure, for example, the first voltage may be a low voltage such as being less than 1 volt (V), and the second voltage may be a high voltage such as being greater than 1V. For example, as shown in FIG. 7b, it may control the voltage difference between the first upper transparent electrode 202 and the first lower transparent electrode 201 to be the low voltage through the control module, and control the voltage difference between the second upper transparent electrode 204 and the second lower transparent electrode 203 to be the high voltage through the control module, such that the first electrochromic thin film pattern 101 is in the non-light-transmissible state, and the second electrochromic thin film pattern 102 is in the light-transmissible state.

Step 702: forming the first mask pattern on the base substrate of the display substrate by using the first electrochromic thin film pattern.

Figure 7B:
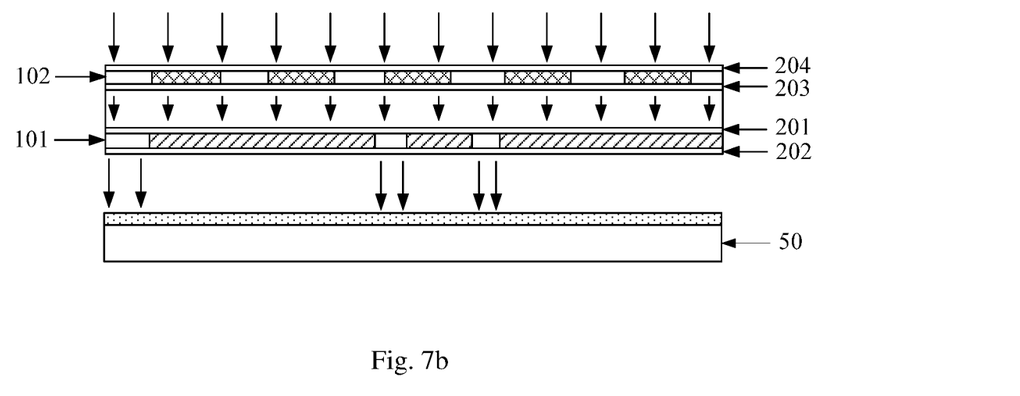
FIG. 7b is a side view showing a first mask pattern being formed according to some embodiments of the present disclosure.

For example, as shown in FIG. 7b, since the second electrochromic thin film pattern 102 is in the light-transmissible state, neither the second electrochromic thin film pattern 102 nor the transparent electrodes in the mask plate may block the light beam. Therefore, the first mask pattern (not shown) may be formed on the base substrate 50 of the display substrate through a single patterning process by using the first electrochromic thin film pattern 101 in the non-light-transmissible state.

Step 703: adjusting the first electrochromic thin film pattern to be in the light-transmissible state by controlling the voltage difference between the first upper transparent electrode and the first lower transparent electrode to be the second voltage through the control module, and adjusting the second electrochromic thin film pattern to be in the non-light-transmissible state by controlling the voltage difference between the second upper transparent electrode and the second lower transparent electrode to be the first voltage through the control module.

For example, it may control the voltage difference between the first upper transparent electrode 202 and the first lower transparent electrode 201 to be the high voltage through the control module, and control the voltage difference between the second upper transparent electrode 204 and the second lower transparent electrode 203 to be the low voltage through the control module, such that the first electrochromic thin film pattern 101 is in the light-transmissible state, and the second electrochromic thin film pattern 102 is in the non-light-transmissible state.

Step 704: forming the second mask pattern on the base substrate where the first mask pattern has been formed by using the second electrochromic thin film pattern.

Figure 7C:
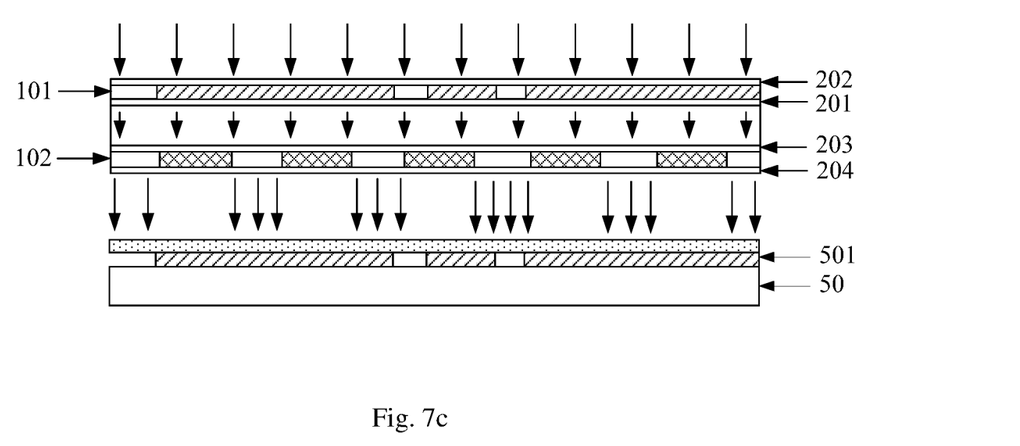
FIG. 7c is a side view showing a second mask pattern being formed according to some embodiments of the present disclosure.

As shown in FIG. 7c, when the first electrochromic thin film pattern 101 in the mask plate is adjusted to be in the light-transmissible state, and the second electrochromic thin film pattern 102 in the mask plate is adjusted to be in the non-light-transmissible state, the mask plate is turned over, such that the side of mask plate where the second electrochromic thin film pattern 102 is formed faces the display substrate, and then the second mask pattern (not shown) may be formed on the base substrate 50 where the first mask pattern 501 has been formed through a single patterning process by using the second electrochromic thin film pattern 102 in the non-light-transmissible state.

Due to a fact that an orthogonal projection of the first electrochromic thin film pattern 101 on the transparent substrate is different from an orthogonal projection of the second electrochromic thin film pattern 102 on the transparent substrate, the first and the second mask patterns formed on the base substrate of the display substrate by these two layers of electrochromic thin film patterns are different from each other, so as to reduce the number of mask plates required for manufacturing the display substrate.

It should be noted that, the above single patterning process includes procedures such as photoresist coating, exposing, developing, etching, and photoresist removing.

It should be further noted that, the method for manufacturing the display substrate in the embodiments of the present disclosure may be applied to the mask plate in any one of FIGS. 2-4. For details of manufacturing the display substrate by using the mask plate in any one of FIGS. 2-4, it may refer to the above steps 701-704.

It should be further noted that, alternatively, in the embodiment of FIG. 7c, the mask plate may not be turned over. In the actual implementation, the mask plate is typically turned over, such that the second electrochromic thin film pattern 102 in the non-light-transmissible state is closer to or even in contact with the base substrate where the second mask pattern is to be formed. As a result, when the second electrochromic thin film pattern 102 is used as a mask for exposure, the second electrochromic thin film pattern 102 is conveyed to the base substrate in a more accurate manner, which contributes to improve repeatability of the second mask pattern, reduce a distortion of the pattern formed on the base substrate, and improve a precision of the pattern formed on the base substrate.

It should be further noted that, in consideration of technical maturity, the electrochromic thin film pattern may be made of Prussian blue in the above embodiments. In the case that the electrochromic thin film pattern is made of Prussian blue, when the low voltage is applied across the electrochromic thin film pattern, the electrochromic thin film pattern is in the non-light-transmissible state and in the color of dark blue, and when the high voltage is applied across the electrochromic thin film pattern, the electrochromic thin film pattern is transparent and in the light-transmissible state. A person skilled in the art may understand that, the material of the electrochromic thin film pattern may be any material that is repeatedly switchable between the non-light-transmissible state and the light-transmissible state.

Thus, according to the method for manufacturing the display substrate in the embodiments of the present disclosure, two different mask patterns may be formed on the display substrate by using the electrochromic thin film patterns at two sides of the mask plate. As compared with the techniques for manufacturing the display substrate in the related art, it enables to reduce the number of mask plates required for manufacturing the display substrate, thereby to simplify the process of manufacturing the TFT-LCD, and reduce the cost for manufacturing the TFT-LCD.

The present disclosure further provides in some embodiments a display substrate. The display substrate may be manufactured according to the above methods.

Accordingly, the present disclosure further provides a display panel including the above display substrate manufactured according to the above methods. Therefore, the display panel may be manufactured in a simpler and lower cost manner.

Accordingly, the present disclosure further provides in some embodiments a display device including the above display panel. Therefore, the display device may be manufactured in a simpler and lower cost manner. For example, the display device may be a notebook computer, a mobile phone, a digital camera, a flat panel computer, a navigator, a television, a monitor or any other product or part that has a display function. A person skilled in the art should understand that the display device may include other indispensable components, which will not be elaborated herein and do not confine the scope of the present disclosure.

The present disclosure provides in some embodiments a mask plate, a method for manufacturing the mask plate and a usage of the mask plate in manufacturing a display substrate are provided. The mask plate includes: a transparent substrate, and at least two layers of electrochromic thin film patterns arranged on the transparent substrate, wherein each of the at least two layers of electrochromic thin film patterns is configured to be capable of being switched between a light-transmissible state and a non-light-transmissible state under an effect of an electric field. The mask plate is capable of forming at least two different mask patterns on the display substrate, which reduces the number of mask plates required for manufacturing the display substrate, thereby to simplify the process of manufacturing the TFT-LCD, and reduce the cost for manufacturing the TFT-LCD.

The above are merely the preferred embodiments of the present disclosure and shall not be used to limit the scope of the present disclosure. Any further improvements, substitutes and modifications made without departing from the spirit and principle of the present disclosure shall also fall within the scope of the present disclosure.

What is claimed is:

1. A mask plate, comprising:
   a transparent substrate; and
   at least two layers of electrochromic thin film patterns arranged on the transparent substrate, wherein each of the at least two layers of electrochromic thin film patterns is configured to be capable of being switched between a light-transmissible state and a non-light-transmissible state under an effect of an electric field,
   transparent electrodes arranged at two sides of each of the at least two layers of electrochromic thin film patterns, wherein the transparent electrodes are configured to apply the electric field to each of the at least two layers of electrochromic thin film patterns,
   wherein each of the transparent electrodes is continuously extended on a whole layer
   wherein the at least two layers of electrochromic thin film patterns are arranged at a same side of the transparent substrate,
   wherein a lower transparent electrode, a first electrochromic thin film pattern, a common transparent electrode, a second electrochromic thin film pattern and an upper transparent electrode are arranged sequentially at the same side of the transparent substrate, and the common transparent electrode is configured to be applied with a voltage less than a voltage applied to the lower transparent electrode and less than a voltage applied to the upper transparent electrode.

2. The mask plate according to claim 1, wherein at least one layer of electrochromic thin film pattern is formed at each of two sides of the transparent substrate.

3. The mask plate according to claim 2, wherein a first lower transparent electrode, a first electrochromic thin film pattern and a first upper transparent electrode are arranged sequentially at one of the two sides of the transparent substrate, and a second lower transparent electrode, a second electrochromic thin film pattern and a second upper transparent electrode are arranged sequentially at the other one of the two sides of the transparent substrate.

4. The mask plate according to claim 1, wherein each of the at least two layers of electrochromic thin film patterns comprises a upper transparent electrode arranged at one side of the layer of electrochromic thin film pattern, and a lower transparent electrode arranged at the other side of the layer of electrochromic thin film pattern, the mask plate further comprises a plurality of transparent insulation layers, and each of the transparent insulation layers is arranged between a lower transparent electrode of one layer of electrochromic thin film pattern and a upper transparent electrode of another layer of electrochromic thin film pattern adjacent to the one layer of electrochromic thin film pattern.

5. The mask plate according to claim 4, wherein a first upper transparent electrode, a first electrochromic thin film pattern, a first lower transparent electrode, a first transparent insulation layer, a second upper transparent electrode, a second electrochromic thin film pattern, a second lower transparent electrode, a second transparent insulation layer, a third upper transparent electrode, a third electrochromic thin film pattern and a third lower transparent electrode are arranged sequentially at the same side of the transparent substrate.

6. The mask plate according to claim 1, wherein each of the at least two layers of electrochromic thin film patterns comprises at least two electrochromic thin film units spaced apart from each other, and a gap between the at least two electrochromic thin film units is filled with a transparent insulation material.

7. The mask plate according to claim 1, further comprising:
a control module arranged at a periphery of the transparent substrate and electrically connected to transparent electrodes of each of the at least two layers of electrochromic thin film patterns, wherein the control module is configured to control a voltage applied across each of the at least two layers of electrochromic thin film patterns.

8. The mask plate according to claim 1, wherein the electrochromic thin film patterns are made of Prussian blue.

9. The mask plate according to claim 6, wherein the transparent insulation material is silicon oxide, silicon nitride or silicon oxynitride.

10. The mask plate according to claim 1, wherein orthogonal projections of the at least two layers of electrochromic thin film patterns on the transparent substrate are different from each other.

11. A method for manufacturing the mask plate according to claim 1, comprising:
providing the transparent substrate; and
forming the at least two layers of electrochromic thin film patterns on the transparent substrate, wherein each of the at least two layers of electrochromic thin film patterns is configured to be capable of being switched between the light-transmissible state and the non-light-transmissible state under the effect of the electric field.

12. The method according to claim 11, wherein forming the at least two layers of electrochromic thin film patterns on the transparent substrate comprises:
forming a lower transparent electrode, a first electrochromic thin film pattern, a common transparent electrode, a second electrochromic thin film pattern and a upper transparent electrode sequentially at one side of the transparent substrate.

13. The method according to claim 11, wherein forming the at least two layers of electrochromic thin film patterns on the transparent substrate comprises:
forming a first upper transparent electrode, a first electrochromic thin film pattern, a first lower transparent electrode, a first transparent insulation layer, a second upper transparent electrode, a second electrochromic thin film pattern, a second lower transparent electrode, a second transparent insulation layer, a third upper transparent electrode, a third electrochromic thin film pattern and a third lower transparent electrode sequentially at one side of the transparent substrate.

* * * * *